(12) United States Patent
Parham et al.

(10) Patent No.: US 8,679,644 B2
(45) Date of Patent: Mar. 25, 2014

(54) ELECTROLUMINESCENT POLYMERS CONTAINING PLANAR ARYLAMINE UNITS, THE PREPARATION AND USE THEREOF

(75) Inventors: Amir Parham, Frankfurt (DE); Susanne Heun, Bad Soden (DE); Aurélie Ludemann, Frankfurt (DE); Arne Buesing, Frankfurt (DE); Junyou Pan, Frankfurt (DE); Heinrich Becker, Hofheim (DE)

(73) Assignee: Merck Patent GmbH, Darmstadt (DE)

( * ) Notice: Subject to any disclaimer, the term of this patent is extended or adjusted under 35 U.S.C. 154(b) by 1125 days.

(21) Appl. No.: 11/587,463

(22) PCT Filed: Apr. 26, 2005

(86) PCT No.: PCT/EP2005/004447
§ 371 (c)(1),
(2), (4) Date: Jan. 10, 2007

(87) PCT Pub. No.: WO2005/104263
PCT Pub. Date: Nov. 3, 2005

(65) Prior Publication Data
US 2008/0102312 A1    May 1, 2008

(30) Foreign Application Priority Data
Apr. 26, 2004   (DE) .................... 10 2004 020 299

(51) Int. Cl.
*H01L 51/54* (2006.01)

(52) U.S. Cl.
USPC .......... 428/690; 428/917; 313/504; 313/505; 313/506; 257/40; 257/E51.05; 257/E51.026; 257/E51.032; 564/26; 564/426; 564/434; 585/27

(58) Field of Classification Search
USPC ............. 428/690, 917; 313/504, 505, 506; 257/40, E51.05, E51.026, E51.032; 564/26, 426, 434; 585/27
See application file for complete search history.

(56) References Cited

U.S. PATENT DOCUMENTS

| | | | |
|---|---|---|---|
| 5,621,131 A | | 4/1997 | Kreuder et al. |
| 5,763,636 A | | 6/1998 | Kreuder et al. |
| 5,777,070 A | * | 7/1998 | Inbasekaran et al. .......... 528/394 |
| 6,066,712 A | | 5/2000 | Ueda et al. |
| 6,309,763 B1 | * | 10/2001 | Woo et al. .................... 428/690 |
| 6,541,602 B1 | | 4/2003 | Spreitzer et al. |
| 6,653,438 B1 | | 11/2003 | Spreitzer et al. |
| 6,956,095 B2 | | 10/2005 | Treacher et al. |
| 6,994,893 B2 | | 2/2006 | Spreitzer et al. |
| 7,323,533 B2 | * | 1/2008 | Becker et al. ................. 528/86 |
| 2003/0165713 A1 | * | 9/2003 | Oguma et al. ................ 428/690 |
| 2004/0135131 A1 | | 7/2004 | Treacher et al. |
| 2004/0206939 A1 | | 10/2004 | Spreitzer et al. |
| 2004/0262574 A1 | | 12/2004 | Suzuki et al. |
| 2005/0038223 A1 | | 2/2005 | Becker et al. |
| 2006/0058494 A1 | | 3/2006 | Busing et al. |
| 2006/0058524 A1 | | 3/2006 | Falcou et al. |
| 2006/0149022 A1 | | 7/2006 | Parham et al. |

FOREIGN PATENT DOCUMENTS

| | | | |
|---|---|---|---|
| DE | 103 49 033 | | 5/2005 |
| EP | 0 707 020 | | 4/1996 |
| EP | 0 842 208 | | 5/1998 |
| EP | 0 894 107 | | 2/1999 |
| EP | 0 953 624 | | 11/1999 |
| JP | 62-208054 | | 9/1987 |
| JP | 2004-067970 A | | 3/2004 |
| JP | 2007-512249 A | | 5/2007 |
| WO | WO-90/13148 | | 11/1990 |
| WO | WO-99/54385 | | 10/1999 |
| WO | WO-00/22026 | | 4/2000 |
| WO | WO-00/22027 | | 4/2000 |
| WO | WO-00/46321 | | 8/2000 |
| WO | WO-01/49769 | | 7/2001 |
| WO | WO-02/072714 | | 9/2002 |
| WO | WO-02/077060 | | 10/2002 |
| WO | WO-03/000773 A1 | | 1/2003 |
| WO | WO 03/000773 A1 * | 1/2003 | ............. C08G 73/02 |
| WO | WO-03/019694 | | 3/2003 |
| WO | WO-03/020790 | | 3/2003 |
| WO | WO-03/048225 | | 6/2003 |
| WO | 1 400 578 | | 3/2004 |
| WO | WO-2004/022626 | | 3/2004 |
| WO | WO-2004/037887 | | 5/2004 |
| WO | WO-2004/070772 | | 8/2004 |

(Continued)

OTHER PUBLICATIONS

Qui et. al., New ladder . . . containing Fluorene unit, Macromolecules, 2003, 36, p. 9823-9829.*

(Continued)

*Primary Examiner* — Gregory Clark

(74) *Attorney, Agent, or Firm* — Novak Druce Connolly Bove + Quigg LLP

(57) ABSTRACT

The present invention relates to polymers which contain certain triarylamine units of the Formula (1)

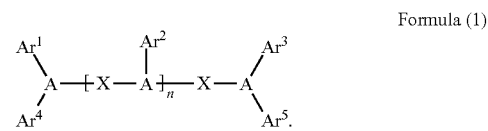

Formula (1)

The materials according to the invention exhibit a longer lifetime than materials in accordance with the prior art and therefore more suitable for use in polymeric organic light-emitting diodes.

33 Claims, 1 Drawing Sheet

(56) References Cited

FOREIGN PATENT DOCUMENTS

| WO | WO-2004/106409 | 12/2004 |
| WO | WO-2004/113412 | 12/2004 |
| WO | WO-2005/014688 | 2/2005 |
| WO | WO-2005/014689 | 2/2005 |
| WO | WO-2005/017065 | 2/2005 |
| WO | WO-2005/049546 A1 | 6/2005 |

OTHER PUBLICATIONS

Kimura et. al., Spirocycle-Incorporated Triphenylamine . . . EL Material, 2000, Chemistry Letters, pp. 3485-3487.*

* cited by examiner

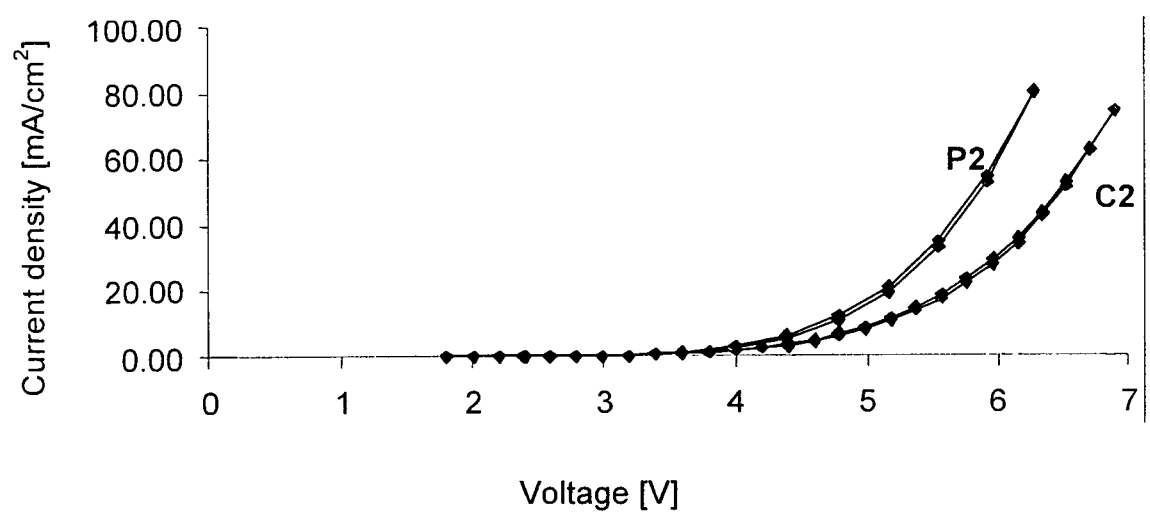
Current density/voltage curve for polymer P2 according to the invention and comparative polymer C2.

ELECTROLUMINESCENT POLYMERS CONTAINING PLANAR ARYLAMINE UNITS, THE PREPARATION AND USE THEREOF

RELATED APPLICATIONS

This application is a national stage application (under 35 U.S.C. 371) of PCT/EP2005/004447 filed Apr. 26, 2005, which claims benefit of German application 10 2004 020 299.0 filed Apr. 26, 2004.

Broadly based research on the commercialisation of display and illumination elements based on polymeric (organic) light-emitting diodes (PLEDS) has been underway for about 13 years. This development was initiated by the fundamental developments disclosed in WO 90/13148. A first, albeit simple product (a small display in a razor from PHILIPS N.V.) has recently been available on the market. However, significant improvements in the materials used are still necessary in order to make these displays a true competitor to the liquid-crystal displays (LCDs) which currently dominate the market.

In order to produce all three emission colours, it is necessary here to copolymerise certain comonomers into the corresponding polymers (cf., for example, WO 00/46321, WO 03/020790 and WO 02/077060). Starting from a blue-emitting base polymer ("backbone"), it is then generally possible to produce the two other primary colours red and green.

It has furthermore been reported that the insertion of certain arylamino groups produces an improvement in the properties:

WO 99/54385 describes polyfluorenes whose efficiency and use voltage can be improved by copolymerising derivatives of triphenylamine, tetraphenyl-p-diaminobenzene or tetraphenyl-4,4'-diaminobiphenyl into the main chain of the corresponding polymers.

WO 01/49769 describes polymers which contain triarylamino groups in which at least one aryl group is a heteroaryl group. No particular advantages of these polymers are described.

WO 04/037887 describes triarylamine units which contain fused aryl substituents, such as, for example, naphthyl units. These are particularly suitable for passive matrix applications.

WO 04/106409 describes tris- and tetrakistriarylamines as hole conductors and emitters in conjugated polymers.

WO 05/017065 proposes triarylphosphine derivatives instead of triarylamine derivatives as hole conductors in conjugated polymers.

Some of the polymers in accordance with the prior art already exhibit good properties on use in PLEDs. In spite of the advances that have already been achieved, however, they do not yet meet the requirements made of them for high-quality applications. In particular, the lifetime of the green- and especially the blue-emitting polymers is still inadequate for many applications.

Surprisingly, it has now been found that conjugated or partially conjugated polymers which contain certain planar bis(triarylamine) units have very good properties which are superior to the prior art. These relate, in particular, to the lifetime, but also the current/voltage curves and the efficiency of the polymers. The present invention therefore relates to these polymers and to the use thereof in PLEDs. Tetraphenyl-p-diaminobenzene, whose central unit (phenylene) also has a planar structure, is unsuitable for this purpose since it results in strong colour shifts in combination with some monomers.

U.S. Pat. No. 6,066,712 describes alternating hole-injection polymers consisting of divinylarylene units and aromatic diamines which are bridged via a polycondensed, cyclic group, such as, for example, fluorene or dihydrophenanthrene. However, these polymers do not appear to be suitable for high-quality OLED applications since very poor lifetimes in the order of 200 h at a very low current density (and thus very low brightness) of only 1 mA/cm² are achieved with them in OLEDs.

The invention relates to conjugated or partially conjugated polymers containing at least 0.1 mol %, preferably at least 1 mol %, particularly preferably at least 5 mol %, very particularly preferably at least 7 mol %, of units of the formula (1)

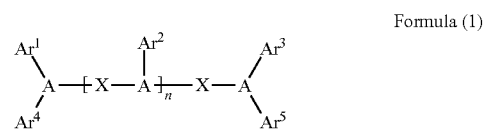

Formula (1)

where the symbols and indices used have the following meaning:

A is on each occurrence, identically or differently, N, P or As;

X is on each occurrence, identically or differently, a divalent planar conjugated system having 6 to 40 C atoms, which contains at least 2 arylene groups and which may be substituted by $R^1$;

$Ar^1$, $Ar^2$, $Ar^3$, $Ar^4$, $Ar^5$ are on each occurrence, identically or differently, an aromatic or heteroaromatic ring system having 2 to 40 C atoms, which may be substituted by one or more radicals $R^1$, with the proviso that none of the groups $Ar^1$ to $Ar^5$ represents a fused ring system if this group does not have a direct bond to the polymer chain;

$R^1$ is on each occurrence, identically or differently, H, F, Cl, Br, I, CN, $NO_2$, OH, $N(R^2)_2$, $Si(R^2)_3$, $B(R^2)_2$, a straight-chain, branched or cyclic alkyl, alkoxy or thioalkoxy group having 1 to 40 C atoms, in which, in addition, one or more non-adjacent C atoms may be replaced by —$CR^2$=$CR^2$—, —C≡C—, —$NR^2$—, —O—, —S—, —CO—O— or —O—CO—O—, where, in addition, one or more H atoms may be replaced by fluorine, an aryl, heteroaryl, aryloxy or heteroaryloxy group having 2 to 40 C atoms, in which, in addition, one or more C atoms may be replaced by O, S or N and which, in addition, may be substituted by one or more non-aromatic radicals $R^1$; two or more of the radicals $R^1$ here may also form an aliphatic or aromatic, mono- or polycyclic ring system with one another;

$R^2$ is on each occurrence, identically or differently, H or an aliphatic or aromatic hydrocarbon radical having 1 to 20 C atoms;

n is on each occurrence, identically or differently, 0, 1 or 2;

the linking of the units of the formula (1) to the polymer takes place via one or two of the units $Ar^1$ to $Ar^5$;

with the exception of polymers of the formula (2)

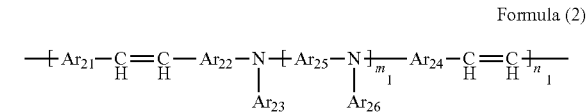

Formula (2)

in which: $Ar_{21}$, $Ar_{22}$, $Ar_{24}$ are each an arylene group, which may carry a substituent; $Ar_{25}$ is an arylene group or a divalent polycondensed ring group, which may carry a substituent;

$Ar_{23}$ and $Ar_{26}$ are each an alkyl group, an aralkyl group or an aryl group, which may carry a substituent; $m_1$ is 0, 1, 2 or 3; n, is a natural number.

The polymers according to the invention are preferably conjugated.

The units of the formula (1) may be bonded into the main chain or side chain of the polymer, preferably into the main chain. If the units of the formula (1) are bonded into the main chain of the polymer, two of the groups $Ar^1$ to $Ar^5$ are divalent groups linked to the polymer chain, while the others are monovalent groups. If the units of the formula (1) are bonded into the side chain of the polymer, one of the groups $Ar^1$ to $Ar^5$ is a divalent group linked to the polymer chain, while the others are monovalent groups.

Although this is evident from the description, it should explicitly be pointed out again here that the structural units of the formula (1) may be asymmetrically substituted, i.e. different atoms A, different groups X and/or different groups $Ar^1$ to $Ar^5$ or different substituents $R^1$ and $R^2$ may be present in a single unit, or these may also be bonded in different positions.

For the purposes of this invention, a "divalent planar conjugated system", as described by the symbol X, is intended to be taken to mean a divalent conjugated system which contains at least two arylene groups which are conjugated with one another and with the atoms A and whose dihedral angle is less than 35°, preferably less than 30°, particularly preferably less than 25°. Since the measured or calculated dihedral angle is always dependent on the determination method, the dihedral angle should for the purposes of this invention be determined by quantum-chemical calculation. For this purpose, the geometry is determined by means of the "Berny" optimisation (H. B. Schlegel et al., *J. Comp. Chem.* 1996, 17, 49) using semi-empirical method AM1 (for example M. J. S. Dewar et al., *J. Am. Chem. Soc.* 1985, 107, 3902) in internal coordinates. The energies and orbitals are then calculated by density functional theory using the hybrid functional B3PW91 (J. P. Perdew, *Phys. Rev. B* 1996, 54, 16533) and the "split valence" base set 6-31 G(d) (J. A. Pople et al., *J. Phys. Chem.* 1971, 54, 724), all calculations being carried out using the Gaussian 98 program package (J. A. Pople, Gaussian, Inc., Pittsburgh Pa., 2001). The planar conjugated system here does not necessarily have to contain only conjugated groups, but may also contain, for example, aliphatic bridges which bridge the arylene groups and thus effect the planarity of the system. The system may likewise be substituted, where the substituents themselves may also in turn form one or more ring systems. Preference is given to rigid planar conjugated systems which cannot deviate from planarity by rotation about a single bond.

Examples of planar conjugated systems are fluorene (dihedral angle in the diamine 0.1°), trans-indenofluorene (dihedral angle in the diamine 0.5°), dihydrophenanthrene (dihedral angle in the diamine 20.2°) and tolan (dihedral angle in the diamine 0.7°), where the tolan is not a rigid system. By contrast, the dihedral angle in the biphenyl as used in accordance with the prior art is 42°; biphenyl is thus not a planar system.

For the purposes of this application, an arylene group is taken to mean a simple or fused divalent aromatic or heteroaromatic group, such as, for example, phenylene, naphthylene, etc., whereas, for example, a biphenyl system or a fluorene system is not intended to be taken to mean a simple arylene group since two phenylene units here are bonded via a single bond (and in fluorene also via an additional non-conjugated bridge). The aromatic groups here contain at least 6 C atoms and the heteroaromatic groups at least 2 C atoms.

For the purposes of this invention, an aromatic or heteroaromatic ring system is intended to be taken to mean a system which does not necessarily contain only aromatic or heteroaromatic groups, but instead in which a plurality of aromatic or heteroaromatic groups may also be interrupted by a short non-aromatic unit (<10% of the atoms other than H, preferably <5% of the atoms other than H), such as, for example, $sp^3$-hybridised C, O, N, etc. Thus, for example, systems such as 9,9'-spirobifluorene, 9,9-diarylfluorene, triarylamine, etc., are also intended to be taken to mean aromatic ring systems for the purposes of this invention. The aromatic ring systems here contain at least 6 C atoms and the heteroaromatic ring systems at least 2 C atoms.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is particularly preferably taken to mean methoxy, ethoxy, n-propoxy, i-propoxy, n-butoxy, i-butoxy, s-butoxy, t-butoxy or 2-methylbutoxy. An aromatic or heteroaromatic ring system having 2 to 40 C atoms, which may also in each case be substituted by the above-mentioned radicals R and which may be linked via any desired positions on the aromatic or heteroaromatic ring system, is taken to mean, in particular, groups which are derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazineimidazole, quinoxalineimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of this invention, conjugated polymers are polymers which contain principally $sp^2$-hybridised (or optionally also sp-hybridised) carbon atoms, which may also be replaced by corresponding hetero atoms, in the main chain. In the simplest case, this means the alternating presence of double and single bonds in the main chain. Principally means that naturally (non-randomly) occurring defects which result in conjugation interruptions do not devalue the term "conjugated polymer". Furthermore, the term conjugated is likewise used in this application text if, for example, arylamine, arylphosphine or arylarsine units, such as, for example, units of the formula (1), and/or certain heterocyclic radicals (i.e. conjugation via N, O, P or S atoms) and/or organometallic complexes (i.e. conjugation via the metal atom) are located in the main chain. By contrast, units such as, for example, simple alkyl bridges, (thio)ether, ester, amide or imide links would clearly be defined as non-conjugated segments. A partially conjugated polymer is intended to be taken to mean a polymer in which relatively long conjugated sections in the main chain are interrupted by non-conjugated sections, or which contains relatively long conjugated sections in the side chains of a polymer which is non-conjugated in the main chain.

The incorporation of the units of the formula (1) into the conjugated polymer can take place via any desired positions of the aromatic units $Ar^1$ to $Ar^5$. The incorporation into the side chain preferably takes place via group $Ar^1$ and the incorporation into the main chain via groups $Ar^1$ and $Ar^3$. It is preferred here for the linking to take place in such a way that an even number of C atoms (or corresponding hetero atoms, i.e. N, O and/or S) lies between the link to the polymer and the nitrogen or phosphorus or arsenic atom A. The number of C atoms (or corresponding hetero atoms) is particularly preferably a multiple of four.

Besides units of the formula (1), the polymers according to the invention preferably also contain further structural elements and should thus be referred to as copolymers. Reference may also be made here, in particular, to the relatively extensive listings in WO 02/077060, in WO 05/014689 and the references cited therein. These further structural units may originate, for example, from the classes described below:

Group 1: Units which Represent the Polymer Backbone:

Units in this group are those which contain aromatic, carbocyclic structures having 6 to 40 C atoms, which may be substituted or unsubstituted. Suitable here are fluorene derivatives (for example EP 0842208, WO 99/54385, WO 00/22027, WO 00/22026, WO 00/46321). Furthermore, spirobifluorene derivatives (for example EP 0707020, EP 0894107, WO 03/020790) are also a possibility. Polymers which contain a combination of the two first-mentioned monomer units (WO 02/077060) have also already been proposed. WO 05/014689 describes dihydrophenanthrene derivatives. Furthermore, cis- or trans-indenofluorene derivatives (for example GB 0226010.7, WO 04/113412) are suitable, but also, for example, dihydropyrene or tetrahydropyrene derivatives and further aromatic structures not listed explicitly.

Group 2: Units which Modify the Morphology or Emission Colour:

Structural elements which are able to influence the morphology, but also the emission colour of the resultant polymers, are also possible. Preference is given here to substituted or unsubstituted aromatic structures having 6 to 40 C atoms or also tolan, stilbene or bisstyrylarylene derivatives, such as, for example, 1,4-phenylene, 1,4-naphthylene, 1,4- or 9,10-anthrylene, 1,6- or 2,7- or 4,9-pyrenylene, 3,9- or 3,10-perylenylene, 2,7- or 3,6-phenanthrenylene, 4,4'-biphenylylene, 4,4"-terphenylylene, 4,4'-bi-1,1'-naphthylylene, 4,4'-stilbenylene or 4,4"-bisstyrylarylene derivatives.

Group 3: Units which Enhance the Hole-Injection and/or -Transport Properties of the Polymers:

These are generally aromatic amines or electron-rich heterocycles, such as, for example, substituted or unsubstituted triarylamines, benzidines, N,N,N',N'-tetraaryl-para-phenylenediamines, triarylphosphines, phenothiazines, phenoxazines, dihydrophenazines, thianthrenes, dibenzo-p-dioxins, phenoxathiynes, carbazoles, azulenes, thiophenes, pyrroles, furans and further O-, S- or N-containing heterocycles having a high HOMO (HOMO=highest occupied molecular orbital). However, since the units of the formula (1) already have hole-conducting properties, the polymers according to the invention may have adequate hole conductivity even without the additional use of further hole-transport units.

Group 4: Units which Enhance the Electron-Injection and/or -Transport Properties of the Polymers:

These are generally electron-deficient aromatics or heterocycles, such as, for example, substituted or unsubstituted pyridines, pyrimidines, pyridazines, pyrazines, oxadiazoles, quinolines, quinoxalines, benzothiadiazoles or phenazines, but also compounds such as triarylboranes and further O-, S- or N-containing heterocycles having a low LUMO (LUMO=lowest unoccupied molecular orbital).

Group 5: Units which have Combinations of Individual Units from Group 3 and Group 4:

It may also be preferred for units in which structures which enhance the hole mobility and which enhance the electron mobility are bonded directly to one another to be present in the polymers according to the invention. Some of these units shift the emission colour into the green, yellow or red; their use is thus suitable, for example, for the production of other emission colours from originally blue-emitting polymers.

Group 6: Units which Emit Light from the Triplet State or Improve the Transfer from the Singlet State to the Triplet State Structural units from group 6 are those which are able to emit light from the triplet state with high efficiency, even at room temperature, i.e. exhibit electrophosphorescence instead of electrofluorescence. Suitable for this purpose are firstly compounds which contain heavy atoms having an atomic number of greater than 36. Particularly suitable compounds are those which contain d or f transition metals which satisfy this condition. Very particular preference is given to structural units which contain elements from groups 8 to 10 (Ru, Os, Rh, Ir, Pd, Pt), in particular iridium and/or platinum. These metal complexes may be bonded into the main chain and/or into the side chain of the polymer.

For use of such structural elements, it is preferred to employ in a supporting manner further structural elements which improve the transition from the singlet state to the triplet state and thus the electrophosphorescence properties. Suitable for this purpose are, for example, carbazole units, preferably bridged carbazole dimer units, as described in WO 04/070772 and WO 04/113468, but also, for example, keto units, as described in the unpublished application DE 10349033.7.

Preference is given to polymers according to the invention which, besides structural units of the formula (1), additionally also contain one or more units selected from groups 1 to 6. It may also be advantageous here for more than one structural unit from one of groups 1 to 6 to be present at the same time.

Particular preference is given to polymers which, besides units of the formula (1), also contain units from group 1, very particularly preferably at least 50 mol % of these units. The units from group 1 are preferably selected from spirobifluorene, fluorene, dihydrophenanthrene, cis-indenofluorene and/or trans-indenofluorene, which may be substituted or unsubstituted.

Preference is given to a proportion of 1-50 mol % of units of the formula (1). Particular preference is given to a proportion of 5-30 mol % of units of the formula (1), very particularly preferably a proportion of 7-15 mol %. This proportion has proven particularly suitable, in particular, for electroluminescent polymers. For other applications, such as, for example, for charge-transport polymers in various applications, a significantly higher proportion of units of the formula (1) may be suitable, for example up to 100 mol % of units of the formula (1).

Preference is given to polymers according to the invention in which A on each occurrence, identically or differently, stands for N or P, particularly preferably for N. Preference is furthermore given to polymers according to the invention in which the symbol X, identically or differently on each occurrence, stands for a unit of the formula (3)

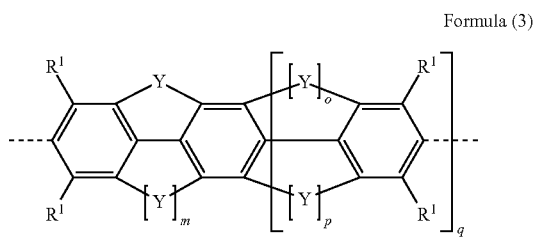

Formula (3)

where the following applies to the symbols and indices used:

Y is on each occurrence, identically or differently, —C(R$^1$)$_2$—, —C(R$^1$)$_2$—C(R$^1$)$_2$—, —N(R$^1$)—, —O—, —S—, —P(R$^1$)—, —P(=O)(R$^1$)—, —O—C(R$^1$)$_2$— or —O—C(=O)—, preferably —C(R$^1$)$_2$— or —C(R$^1$)$_2$—C(R$^1$)$_2$—;

m is on each occurrence, identically or differently, 0 or 1, preferably 0, where in the case where the index m=0, the radical Y is omitted and does not correspond to a chemical bond;

o, p are on each occurrence, identically or differently, 0 or 1, with the proviso that o and p cannot simultaneously be 0, where in the case where one of the indices o or p=0, the radical Y is omitted and does not correspond to a chemical bond;

q is on each occurrence, identically or differently, 0, 1 or 2, preferably 0 or 1; the dashed bond in formula (3) here represents the link from this formula to the atom A in structural units of the formula (1).

Preference is furthermore given to polymers according to the invention in which the symbols Ar$^1$ to Ar$^5$ on each occurrence, identically or differently, stand for an aromatic or heteroaromatic ring system having 4 to 30 C atoms, which may be substituted by R$^1$, preferably for an aromatic or heteroaromatic ring system having 6 to 25 C atoms, which may be substituted by R$^1$.

The index n furthermore preferably stands for 0 or 1, particularly preferably for 0.

Preference is furthermore given to symmetrical units of the formula (1). This preference is due to the easier synthetic accessibility of the monomers. It is thus preferred for all A in a unit of the formula (1) to be identical and for the units to have a symmetrical structure with respect to Ar$^1$ to Ar$^5$. If a plurality of units X occur, these should also preferably be selected to be identical.

Examples of units of the formula (1) are structures in accordance with Examples (1) to (30) shown, where the dashed bonds denote a link in the polymer. For better clarity, possible substituents are generally not shown, but may well be preferred for synthetic reasons, for the solubility, for the efficiency or for the stability of the systems.

Example 1

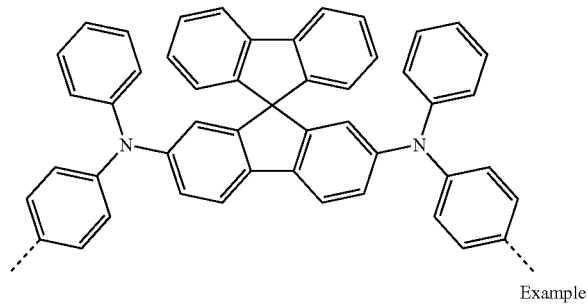

Example 2

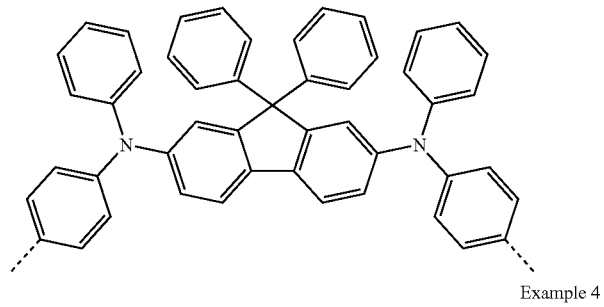

Example 3

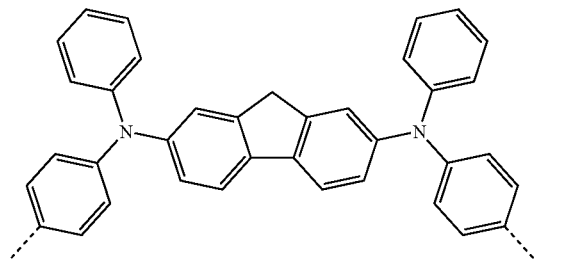

Example 4

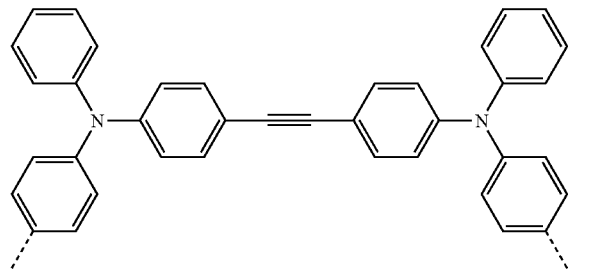

Example 5

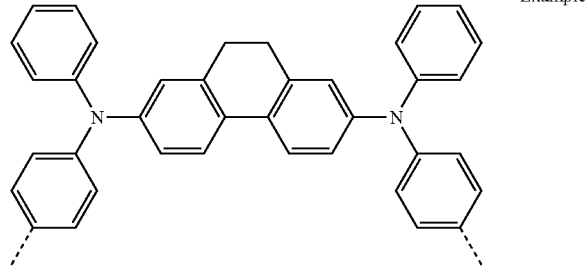

Example 6

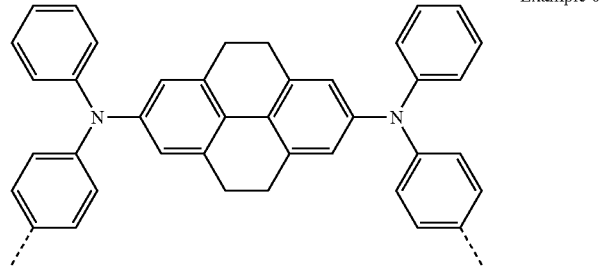

-continued
Example 7
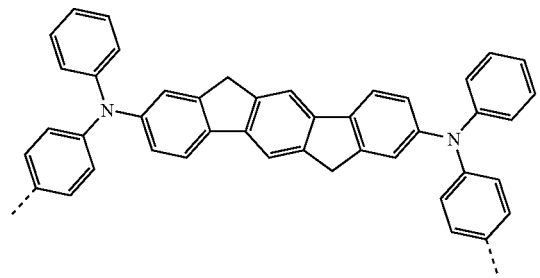
Example 8
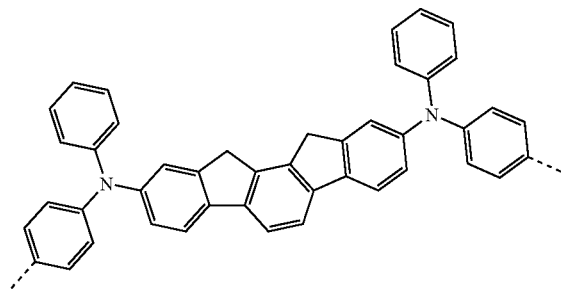
Example 9
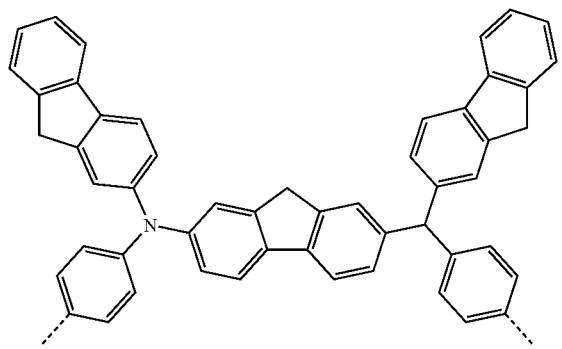
Example 10
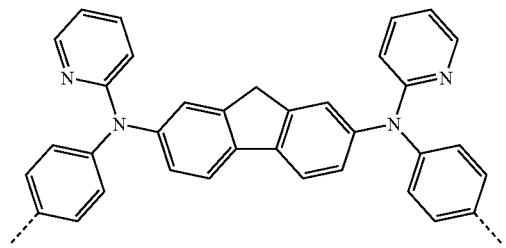
Example 11
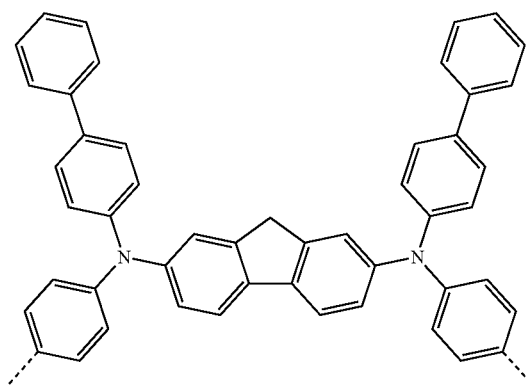
Example 12
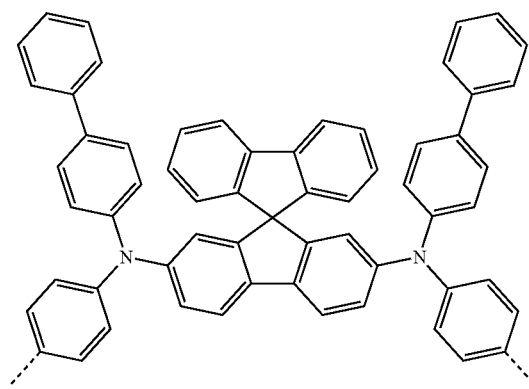
Example 13
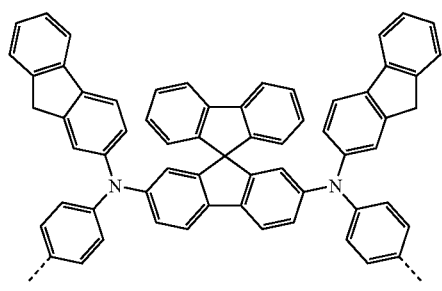
Example 14
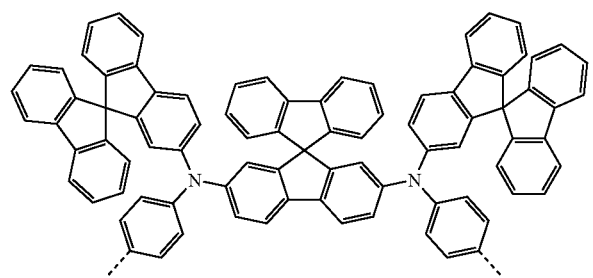
Example 15
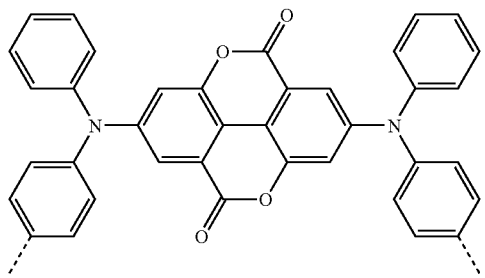
Example 16
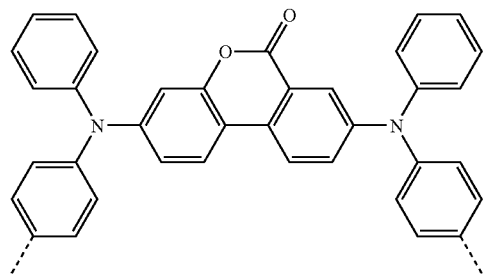

-continued
Example 17
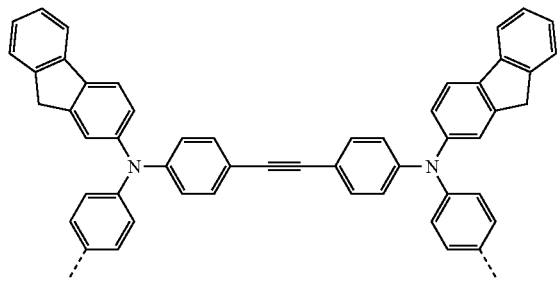
Example 18
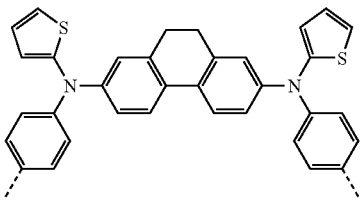
Example 19
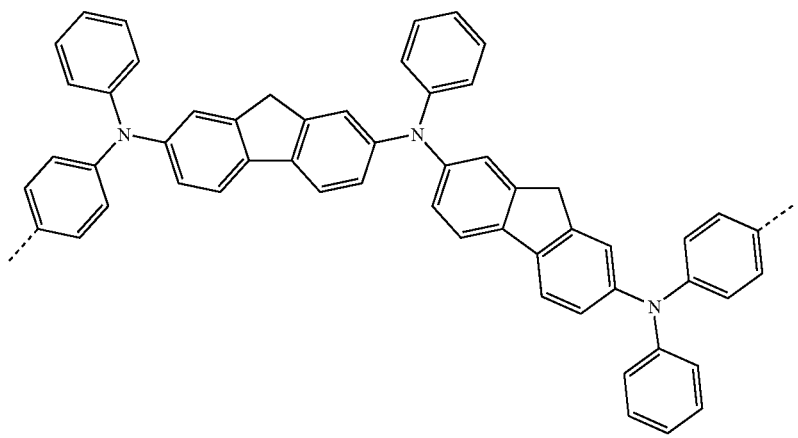
Example 20
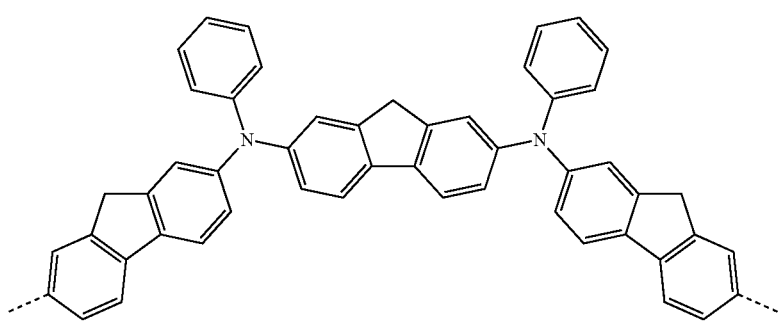
Example 21
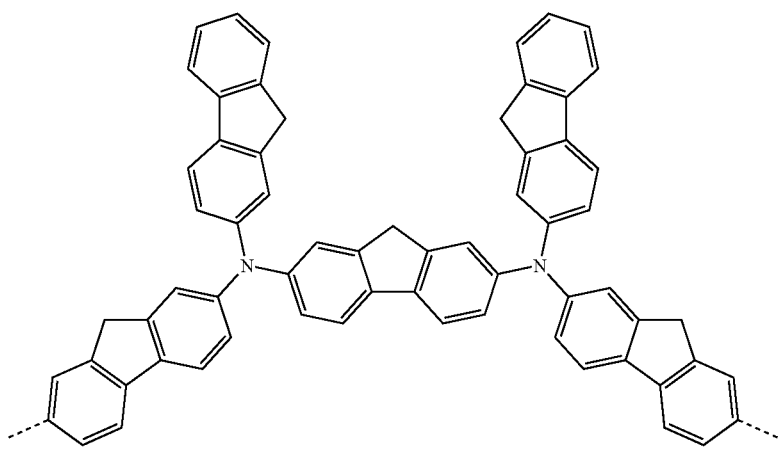

-continued

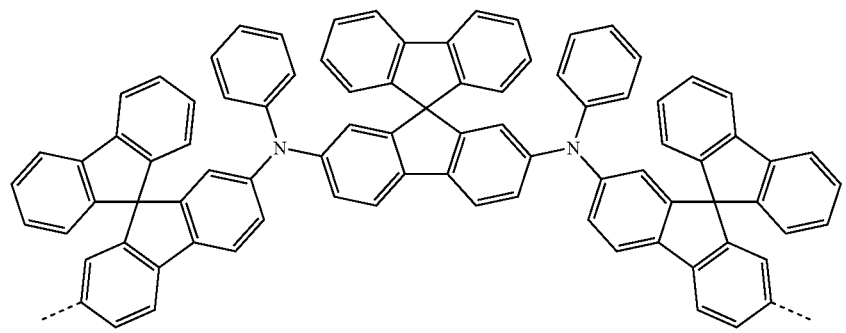
Example 22

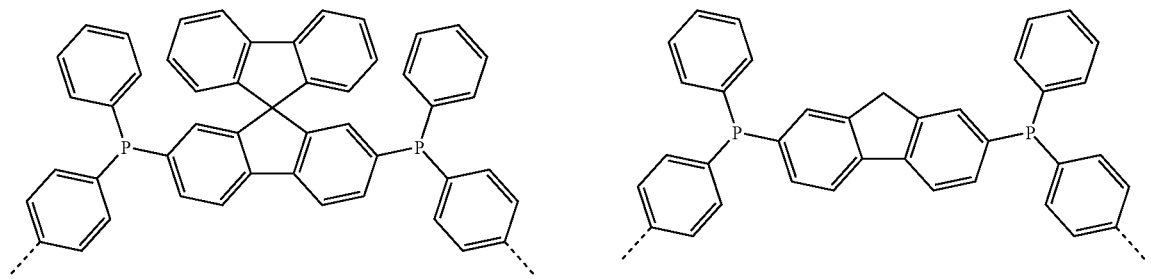
Example 23    Example 24

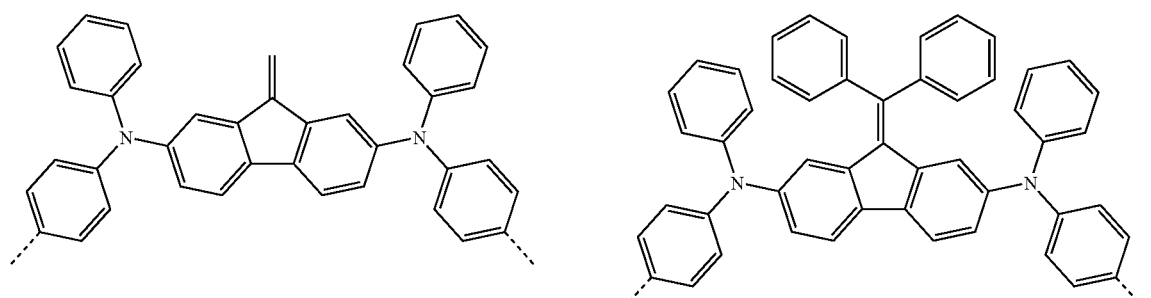
Example 25    Example 26

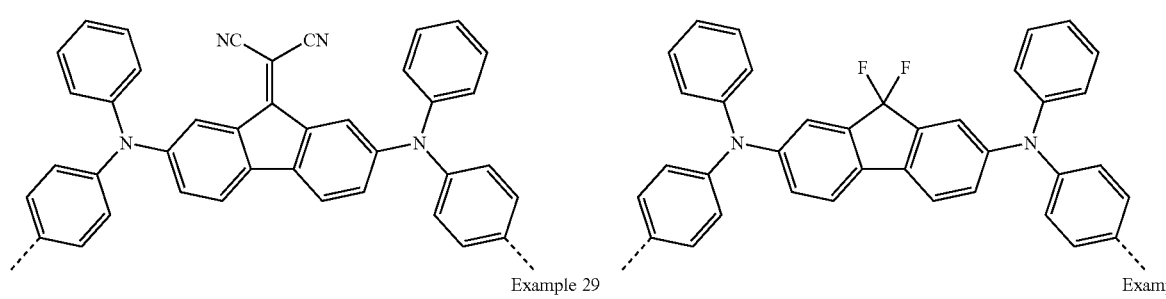
Example 27    Example 28

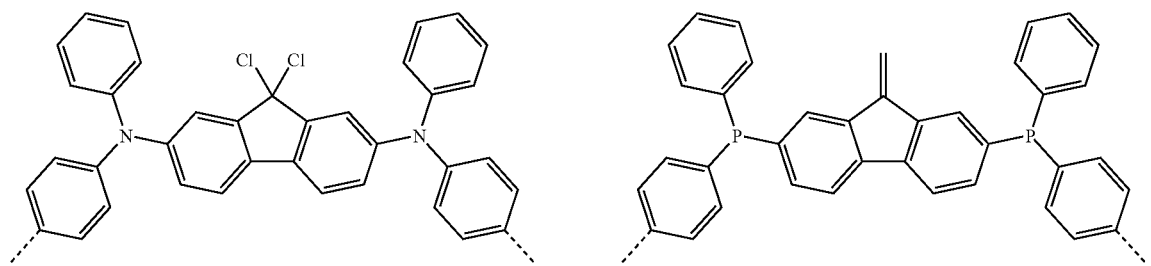
Example 29    Example 30

The polymers according to the invention are either homopolymers comprising units of the formula (1) or copolymers. Besides one or more structures of the formula (1), copolymers according to the invention may potentially have one or more further structures from the above-mentioned groups 1 to 6. The copolymers according to the invention may have random, alternating or block-like structures or also have a plurality of these structures in an alternating arrangement.

The way in which copolymers having block-like structures can be obtained is described in detail, for example, in WO 05/014688. This is part of the present application by way of reference. It should also be emphasised at this point that the polymer does not have to have a linear structure, but instead may also be branched, or may also have dendritic structures.

The polymers according to the invention preferably have 10 to 10,000, particularly preferably 20 to 5000, very particularly preferably 50 to 2000 recurring units.

The polymers according to the invention are generally prepared by polymerisation of one or more types of monomer, of which at least one monomer results in units of the formula (1) in the polymer. There are in principle many corresponding polymerisation reactions. However, a few types which result in C—C or C—N links have proven particularly successful here:
(A) SUZUKI polymerisation;
(B) YAMAMOTO polymerisation;
(C) STILLE polymerisation;
(D) HARTWIG-BUCHWALD polymerisation.

The way in which the polymerisation can be carried out by these methods and the way in which the polymers can be separated off from the reaction medium and purified is described in detail, for example, in WO 03/048225 or WO 04/022626.

For the synthesis of the polymers, the corresponding monomers are required. For the synthesis of units from groups 1 to 6, reference is made to WO 05/014689 and the literature cited therein.

Monomers which result in structural units of the formula (1) in polymers according to the invention are corresponding triarylamine derivatives (or the corresponding phosphorus and arsenic derivatives) which are suitably substituted at suitable positions and have suitable functionalities which allow this monomer unit to be incorporated into the polymer.

These monomers are novel and are therefore likewise a subject-matter of the present invention.

The invention furthermore relates to bifunctional monomeric compounds of the formula (4) and formula (5)

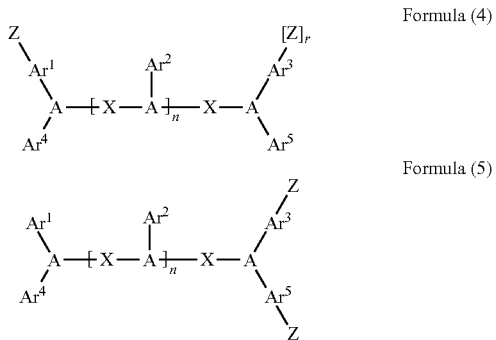

Formula (4)

Formula (5)

where A, X, $Ar^1$, $Ar^2$, $Ar^3$, $Ar^4$, $Ar^5$, $R^1$, $R^2$ and n have the same meaning as described under formula (1), and furthermore:
Z is on each occurrence, identically or differently, a functional group which copolymerises under conditions of the C—C or C—N linking reactions, preferably Cl, Br, I, O-tosylate, O-triflate, O—$SO_2R^1$, $B(OR^1)_2$ or $Sn(R^1)_3$, particularly preferably Br, I, $B(OR^1)_2$ or $Sn(R^1)_3$;
r is 0 or 1.

The C—C linking reactions are preferably selected from the groups of the SUZUKI coupling, the YAMAMOTO coupling and the STILLE coupling; the C—N linking reaction is preferably a HARTWIG-BUCHWALD coupling.

For functional monomeric compounds of the formula (4) and formula (5), the same preference as described above for structural units of the formula (1) applies here.

It may additionally be preferred not to use the polymer according to the invention as a pure substance, but instead as a mixture (blend) together with further polymeric, oligomeric, dendritic or low-molecular-weight substances of any desired type. These may, for example, improve the electronic properties or emit themselves. However, electronically inert blend constituents may also be appropriate in order, for example, to control the viscosity of a solution or the morphology of the film formed. Blends of this type are therefore also part of the present invention.

The invention furthermore relates to solutions and formulations of one or more polymers or blends according to the invention in one or more solvents. The way in which polymer solutions can be prepared is described, for example, in WO 02/072714, WO 03/019694 and the literature cited therein. These solutions can be used to produce thin polymer layers, for example by area-coating methods (for example spin coating) or by printing processes (for example ink-jet printing).

The polymers and blends according to the invention can be used in PLEDs. The way in which PLEDs can be produced is described in detail as a general process in WO 04/037887, which should be correspondingly adapted for the individual case. As described above, the polymers according to the invention are very particularly suitable as electroluminescent materials in PLEDs or displays produced in this way.

For the purposes of the invention, electroluminescent materials are taken to mean materials which can be used as active layer in a PLED. Active layer means that the layer is capable of emitting light on application of an electric field (light-emitting layer) and/or that it improves the injection and/or transport of positive and/or negative charges (charge-injection or charge-transport layer). Use as "buffer layer" between an emission layer and a hole-injection layer is also possible.

The invention therefore also relates to the use of a polymer or blend according to the invention in a PLED, in particular as emitting material.

The invention furthermore relates to a PLED having one or more active layers, where at least one of these active layers comprises one or more polymers or blends according to the invention. The active layer may be, for example, a light-emitting layer and/or a transport layer and/or a charge-injection layer.

The polymers according to the invention have the following surprising advantages over the polyspirobifluorenes described in WO 03/020790, the polyfluorenes described in WO 02/077060 and the polydihydrophenanthrenes described in WO 05/014689, which contain no units of the formula (1) and are cited here as closest prior art:

(1) The lifetime is longer than in comparable polymers which, with an otherwise identical composition, contain no units of the formula (1), but instead contain bis(triarylamine) derivatives whose central aromatic unit does not have a planar structure. An improvement in the lifetime is of enormous importance for use since, in particular in the case of blue- and green-emitting polymers, the inadequate lifetime has hitherto been the greatest hindrance to use.

(2) The polymers according to the invention have, with an otherwise identical composition, comparable or higher luminous efficiencies in the application. This is of enormous importance since either the same brightness can thus be achieved for lower energy consumption, which is very important, in particular, in mobile applications (displays for mobile phones, pagers, PDAs, etc.), which rely on batteries, rechargeable or otherwise. Conversely, higher brightnesses are obtained for the same energy consumption, which may be interesting, for example, for illumination applications.

(3) The current/voltage curves are steeper if triarylamine units having a planar (and preferably rigid) bridging unit are used. The triarylamine units according to the invention are thus better hole conductors than triarylamine units in accordance with the prior art.

The present application text and also the examples below are directed to the use of polymers according to the invention in relation to PLEDs and corresponding displays. In spite of this restriction of the description, it is possible for the person skilled in the art, without further inventive step, to use the polymers according to the invention as semiconductors (or, in the case of suitable doping, also conductors) also for further uses in other electronic devices, for example in organic field-effect transistors (O-FETs), organic integrated circuits (O-ICs), organic thin-film transistors (O-TFTs), organic solar cells (O-SCs), organic field-quench devices (O-FQDs) or also organic laser diodes (O-lasers), to mention but a few applications. The present invention likewise relates to the use of the polymers according to the invention in the corresponding devices. The invention thus likewise relates to organic field-effect transistors (O-FETs), organic integrated circuits (O-ICs), organic thin-film transistors (O-TFTs), organic solar cells (O-SCs), organic field-quench devices (O-FQDs) and organic laser diodes (O-lasers) comprising at least one polymer according to the invention.

It is furthermore easy for the person skilled in the art to apply the descriptions given above for conjugated or partially conjugated polymers to conjugated or partially conjugated dendrimers or oligomers without further inventive step. The present invention thus also relates to dendrimers and oligomers of this type.

EXAMPLES

Example 1

Synthesis of N,N'-bis(4-bromophenyl)-N,N'-bis(4-tert-butylphenyl)-9,9-dioctylfluorene-2,7-diamine (Monomer EM1 According to the Invention)

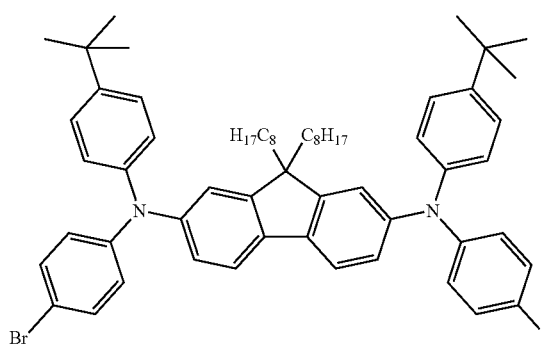

a) N,N'-diphenyl-N,N'-bis(4-tert-butylphenyl)-9,9-dioctylfluorene-2,7-diamine

A degassed solution of 26 g (47.4 mmol) of 2,7-dibromo-9,9-dioctylfluorene (synthesised as described by M. Ranger, M. Leclerc, *Chem. Commun.* 1997, 1597) and 20.2 g (91 mmol) of 4-tert-butylphenylphenylamine (synthesised as described in *J. Org. Chem.* 2003, 68, 452) in 150 ml of toluene was saturated with $N_2$ for 1 h. Then firstly 174 mg (0.86 mmol) of P($^t$Bu)$_3$, then 96 mg (0.42 mmol) of Pd(OAc)$_2$ were added to the solution; 5.4 g (56 mmol) of NaO$^t$Bu in the solid state were subsequently added. The reaction mixture was refluxed for 5 h. After cooling to room temperature, 0.8 g of NaCN and 40 ml of water were carefully added. The organic phase was washed with 4×50 ml of $H_2O$, dried over $MgSO_4$, and the solvents were removed under reduced pressure. Chromatographic purification over silica gel gave a yellow oil. The yield—with a purity of 99.3% according to HPLC—was 33 g (85% of theory).

$^1$H-NMR (CDCl$_3$, 500 MHz): 0.65 (m, 4H), 0.83 (t, J=7.03 Hz, 6H), 0.99-1.28 (m, 20H), 1.31 (s, 18H), 1.71-1.79 (m, 4H), 6.90-7.11 (m, 12H), 7.21-7.31 (m, 10H), 7.40-7.51 (m, 2H).

b) N,N'-bis(4-bromophenyl)-N,N'-bis(4-tert-butylphenyl)-9,9-dioctylfluorene-2,7-diamine (EM1)

36.6 g (43.7 mmol) of N,N'-diphenyl-N,N'-bis(4-tert-butylphenyl)-9,9-dioctylfluorene-2,7-diamine were introduced into 500 ml of THF. A solution of 15.15 g (84.4 mmol) of NBS, dissolved in 300 ml of THF, was subsequently added dropwise at 0° C. with exclusion of light, the mixture was allowed to come to room temperature and was stirred for a further 4 h. 500 ml of water were subsequently added to the mixture, which was extracted with $CH_2Cl_2$. The organic phase was dried over $MgSO_4$, and the solvents were removed under reduced pressure. The product was washed by stirring with hot hexane and filtered off with suction, giving 35 g (68% of theory) of a white solid which, after repeated recrystallisation from ethyl acetate, had an HPLC purity of 99.9%.

$^1$H-NMR (CDCl$_3$, 500 MHz): 0.66 (m, 4H), 0.85 (t, J=7.03 Hz, 6H), 0.99-1.28 (m, 20H), 1.33 (s, 18H), 1.73-1.79 (m, 4H), 6.85-7.10 (m, 112H), 7.21-7.35 (m, 8H), 7.40-7.51 (m, 2H).

Example 2

Synthesis of N,N'-bis(4-bromophenyl)-N,N'-bis(4-tert-butylphenyl)-9,10-dibutyl-9,10-dimethoxy-9,10-dihydrophenanthrene-2,7-diamine (Monomer EM2 According to the Invention)

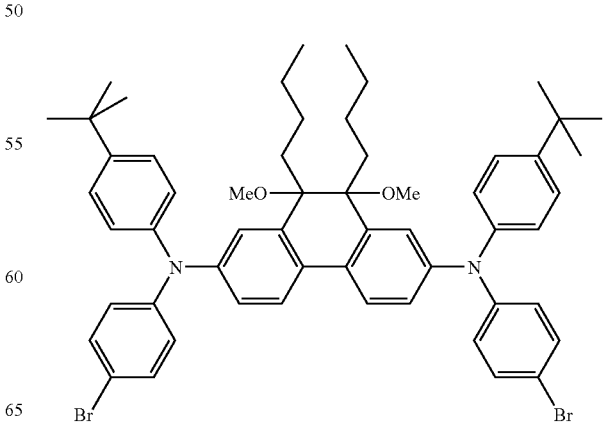

a) N,N'-diphenyl-N,N'-bis(4-tert-butylphenyl)-9,10-dibutyl-9,10-dimethoxy-9,10-dihydrophenanthrene-2,7-diamine The synthesis was carried out analogously to Example 1a), with 24.2 g (47.4 mmol) of 2,7-dibromo-9,10-dibutyl-9,10-dimethoxy-9,10-dihydrophenanthrene (synthesised as described in WO 05/014689) being employed as starting material. Chromatographic purification over silica gel gave a yellow oil. The yield—with a purity of 99.0% according to HPLC—was 30 g (81% of theory).

$^1$H-NMR (CDCl$_3$, 500 MHz): 0.53 (m, 2H), 0.81 (t, J=7.03 Hz, 6H), 0.94-1.19 (m, 6H), 1.25 (s, 18H), 1.62 (m, 2H), 2.05 (t, J=7.03 Hz, 2H), 3.31 (s, 6H), 6.61-7.5 (m, 24H).

b) N,N'-bis(4-bromophenyl)-N,N'-bis(4-tert-butylphenyl)-9,10-dibutyl-9,10-dimethoxy-9,10-dihydrophenanthrene-2,7-diamine (EM2)

The synthesis was carried out analogously to Example 1b), with 34.9 g (43.7 mmol) of N,N'-diphenyl-N,N'-bis(4-tert-butylphenyl)-9,10-dibutyl-9,10-dimethoxy-9,10-dihydrophenanthrene-2,7-diamine being employed as starting material. 24 g (70% of theory) of a white solid which, after repeated recrystallisation from ethyl acetate, had an HPLC purity of 99.9% were obtained.

$^1$H-NMR (CDCl$_3$, 500 MHz): 0.53 (m, 2H), 0.81 (t, J=7.03 Hz, 6H), 0.94-1.19 (m, 6H), 1.25 (s, 18H), 1.62 (m, 2H), 2.05 (t, J=7.03 Hz, 2H), 3.31 (s, 6H), 6.85-7.05 (m, 10H), 7.11-7.20 (m, 2H), 7.25-7.33 (m, 8H), 7.42-7.48 (m, 2H).

Example 3

Synthesis of N,N'-bis(4-bromophenyl)-N,N'-bis(4-tert-butylphenyl)-2',7'-bis(tert-butyl)-9,9'-spirobifluorene-2,7-diamine (Monomer EM3 According to the Invention)

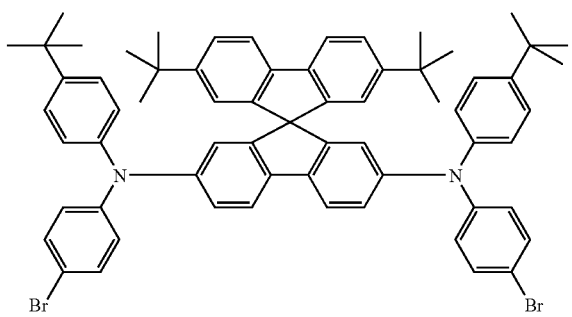

a) N,N'-diphenyl-N,N'-bis(4-tert-butylphenyl)-2',7'-bis(tert-butyl)-9,9'-spirobifluorene-2,7-diamine The synthesis was carried out analogously to Example 1a), with 31.0 g (54 mmol) of 2,7-dibromo-2',7'-bis(tert-butyl)-9,9'-spirobifluorene being employed as starting material. Chromatographic purification over silica gel gave a yellow oil. The yield—with a purity of 99.2% according to HPLC—was 50 g (99% of theory).

$^1$H-NMR (acetone-d$_6$, 500 MHz): 1.28 (s, 36H), 6.39 (s, 2H), 6.81-6.89 (m, 12H), 6.98 (dd, J=2 Hz, J=8.3 Hz, 2H), 7.05-7.20 (m, 12H), 7.34 (dd, J=1.7 Hz, J=8.0 Hz, 2H), 7.06 (d, J=8.0 Hz, 2H), 7.79 (d, J=8.3 Hz, 2H).

b) N,N'-bis(4-bromophenyl)-N,N'-bis(4-tert-butylphenyl)-2',7'-bis(tert-butyl)-9,9'-spirobifluorene-2,7-diamine (EM3)

The synthesis was carried out analogously to Example 1b), with 52 g (60.8 mmol) of N,N'-diphenyl-N,N'-bis(4-tert-butylphenyl)-2',7'-bis(tert-butyl)-9,9'-spirobifluorene-2,7-diamine being employed as starting material. 68 g (97.5% of theory) of a white solid which, after repeated recrystallisation from ethyl acetate, had an HPLC purity of 99.8% were obtained.

$^1$H-NMR (CDCl$_3$, 500 MHz): 1.25 (s, 36H), 6.49 (s, 2H), 6.65-7.15 (m, 20H), 7.32 (dd, J=1.6 Hz, J=8.0 Hz, 2H), 7.56 (d, J=8.0 Hz, 2H), 7.66 (s, J=8.0 Hz, 2H).

Example 4

Synthesis of Further Comonomers

The structures of the further monomers (M) for polymers according to the invention and comparative polymers are shown below. The synthesis of monomers M1 to M6 is described in WO 03/020790, in WO 05/014689 and the literature cited therein.

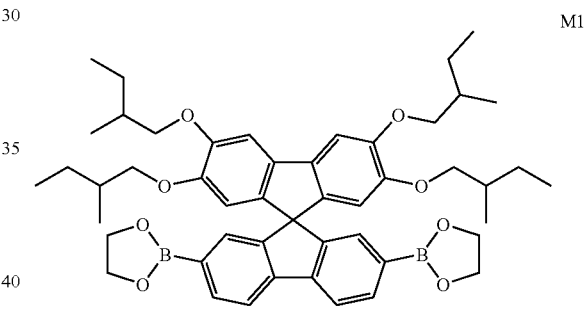

M1

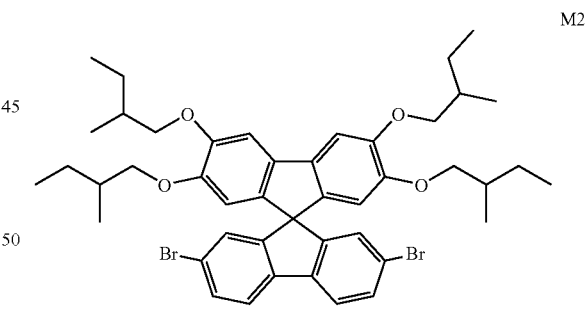

M2

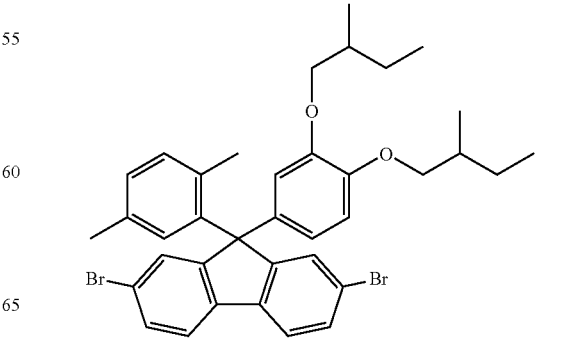

M3

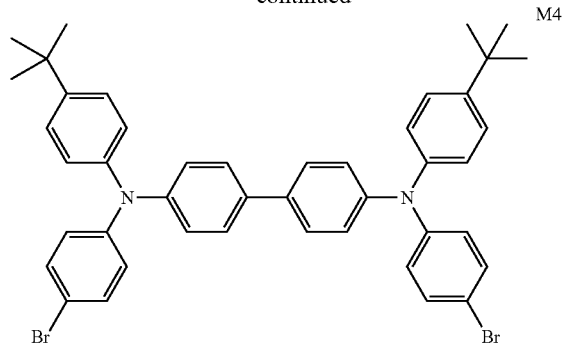

M4

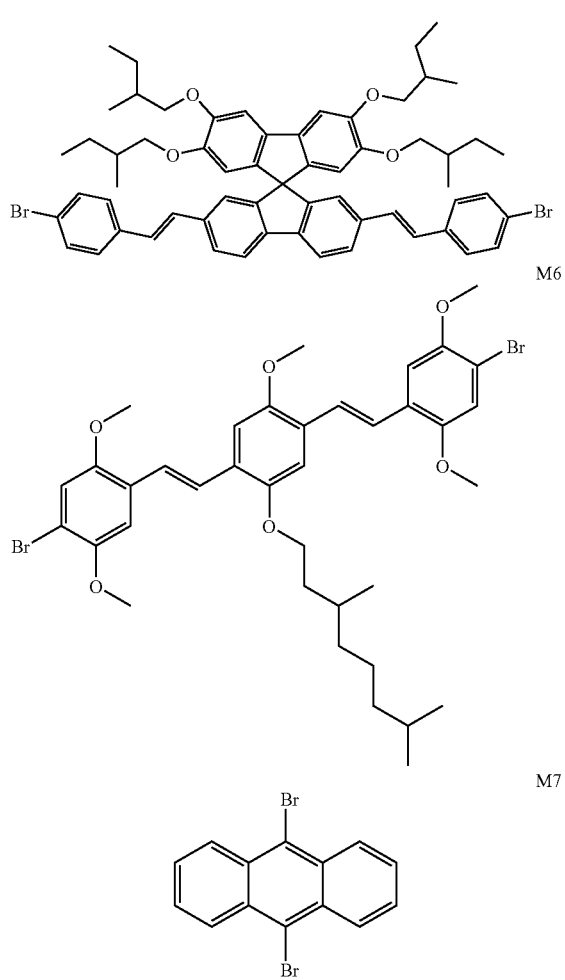

M5

M6

M7

Example 5

Synthesis of the Polymers

The polymers were synthesised by SUZUKI coupling as described in WO 03/048225. The composition of the synthesised polymers P1 to P5 is shown in Table 1. In addition, comparative polymers C1 to C5, which contain monomer M4 instead of monomers EM1 and EM2 according to the invention, were synthesised. The composition of the comparative polymers is likewise shown in Table 1.

Example 6

Production of PLEDs

The polymers were investigated for use in PLEDs. The PLEDs were in each case two-layer systems, i.e. substrate//ITO//PEDOT//polymer//cathode. PEDOT is a polythiophene derivative (Baytron P, from H. C. Stark, Goslar). The cathode used in all cases was Ba/Ag (Aldrich). The way in which PLEDs can be produced is described in detail in WO 04/037887 and the literature cited therein.

Examples 7 to 11

Device Examples

The results obtained using polymers P1 to P5 in PLEDs are shown in Table 1. Also shown are the electroluminescence results obtained using comparative polymers C1 to C5. Since the emission colours of the polymers according to the invention and the comparative polymers are not always identical, corrected values relating to an initial brightness of 400 cd/m$^2$ and a y colour coordinate of 0.2 have been indicated for the lifetime of the blue-emitting polymers in order to obtain better comparability.

As is clearly evident, the polymers according to the invention which contain planar triarylamine units of the formula (1) according to the invention have significantly better electroluminescence than polymers containing triarylamine units in accordance with the prior art, in particular in the lifetime. Thus, an improvement by a factor of up to more than 6 (polymer P2 or C2) is observed in the lifetime. This effect is not so pronounced for all polymers, but a significant increase in the lifetime is observed for all polymers according to the invention.

TABLE 1

Device results using polymers according to the invention and comparative polymers

| Example | Polymer | Amine | Further monomers | Max. eff./cd/A | U @ 100 cd/m$^2$/V | CIE x/y[a] | Corrected lifetime[b]/h |
|---|---|---|---|---|---|---|---|
| 7 | P1 | 10% EM1 | 50% M1, 40% M2 | 3.95 | 4.9 | 0.16/0.23 | 53 |
| 7 (comparison) | C1 | 10% M4 | 50% M1, 40% M2 | 2.86 | 4.4 | 0.16/0.18 | 24 |
| 8 | P2 | 10% EM1 | 50% M1, 40% M3 | 3.78 | 4.1 | 0.17/0.24 | 105 |
| 8 (comparison) | C2 | 10% M4 | 50% M1, 40% M3 | 2.97 | 5.7 | 0.15/0.15 | 17 |
| 9 | P3 | 10% EM1 | 50% M1, 30% M2, 10% M7 | 3.70 | 4.8 | 0.17/0.24 | 55 |
| 9 (comparison) | C3 | 10% M4 | 50% M1, 30% M2, 10% M7 | 2.97 | 4.5 | 0.16/0.21 | 12 |
| 10 | P4 | 10% EM1 | 50% M1, 30% M3, 10% M5 | 4.36 | 4.3 | 0.21/0.36 | 102 |

TABLE 1-continued

Device results using polymers according to the invention and comparative polymers

| Example | Polymer | Amine | Further monomers | Max. eff./cd/A | U @ 100 cd/m²/V | CIE x/y[a] | Corrected lifetime[b]/h |
|---|---|---|---|---|---|---|---|
| 10 (comparison) | C4 | 10% M4 | 50% M1, 30% M3, 10% M5 | 4.38 | 3.8 | 0.19/0.31 | 80 |
| 11 | P5 | 10% EM1 | 50% M1, 20% M3, 20% M6 | 9.24 | 3.4 | 0.32/0.57 | 883 |
| 11 (comparison) | C5 | 10% M4 | 50% M1, 20% M3, 20% M6 | 8.29 | 3.1 | 0.33/0.58 | 384 |

[a]CIE coordinates: colour coordinates of the Commission Internationale de l'Eclairage 1931.
[b]Lifetime: time until the brightness drops to 50% of the initial brightness. The corrected lifetime relates to an energy density of 6.6 W/m², i.e. a brightness of 400 cd/m² at a y CIE colour coordinate of 0.2. The corrected lifetime can be calculated from the lifetime actually measured, from the initial brightness and from the colour coordinates.

Example 12

Comparison of the Current/Voltage Curves

The current density/voltage curves for polymer P2 and comparative polymer C2 are shown in FIG. 1. As is evident, the curve for polymer P2, which contains triarylamine units according to the invention, is significantly steeper than for comparative polymer C2, which contains triarylamine units in accordance with the prior art. It is thus evident that the triarylamine units according to the invention are better hole conductors.

The invention claimed is:

1. A conjugated or partially conjugated polymer comprising from 0.1 mol % to 30 mol % of units of the formula (1)

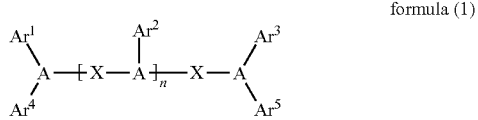

formula (1)

wherein:
A is on each occurrence, identically or differently, N, P or As;
X is on each occurrence, identically or differently, a divalent planar conjugated system having 6 to 40 C atoms, which comprises at least two arylene groups and which is optionally substituted by R1;
$Ar^1$, $Ar^2$, $Ar^3$, $Ar^4$ and $Ar^5$
are on each occurrence, identically or differently, an aromatic or heteroaromatic ring system having 2 to 40 C atoms, which is optionally substituted by one or more radicals $R^1$, with the proviso that none of the groups $Ar^1$ to $Ar^5$ are a fused ring system if this group does not have a direct bond to the polymer chain;
$R^1$ is on each occurrence, identically or differently, H, F, Cl, Br, I, CN, $NO_2$, OH, $N(R^1)_2$, $Si(R^2)_3$, $B(R^2)_2$, a straight-chain, branched or cyclic alkyl, alkoxy or thioalkoxy group having 1 to 40 C atoms, in which, in addition, one or more non-adjacent C atoms is optionally replaced by $-CR^2=CR^2-$, $-NR^2-$, $-O-$, $-S-$, $-CO-O-$ or $-O-CO-O-$, where, in addition, one or more H atoms is optionally replaced by fluorine, an aryl, heteroaryl, aryloxy or heteroaryloxy group having up to 40 C atoms, in which, in addition, one or more C atoms is optionally replaced by O, S or N and which, in addition, may be substituted by one or more non-aromatic radicals $R^1$; two or more of the radicals $R^1$ optionally form an aliphatic or aromatic, mono- or polycyclic ring system with one another;
$R^2$ is on each occurrence, identically or differently, H or an aliphatic or aromatic hydrocarbon radical having 1 to 20 C atoms;
n is on each occurrence, identically or differently, 0, 1 or 2;
the linking of the units of the formula (1) to the polymer takes place via one or two of the groups $Ar^1$ to $Ar^5$;
with the exception of the polymer of the formula (2)

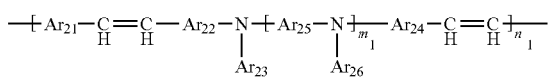

formula (2)

wherein
$Ar_{21}$, $Ar_{22}$, $Ar_{24}$ are each an arylene group, which may carry a substituent; $Ar_{25}$ is an arylene group or a divalent polycondensed ring group, which optionally carry a substituent; $Ar_{23}$ and $Ar_{26}$ are each an alkyl group, an aralkyl group or an aryl group, which optionally carry a substituent; $m_1$ is 0, 1, 2 or 3; $n_1$ is a natural number; and
wherein said conjugated or partially conjugated polymers further comprise one or more units selected from the group consisting of spirobifluorene, fluorene, dihydrophenanthrene, cis-indenofluorene, trans-indenofluorene, dihydropyrene, and tetrahydropyrene.

2. The polymer according to claim 1, wherein the polymers are conjugated polymers.

3. The polymer according to claim 1, wherein the dihedral angle between the at least two arylene groups of unit X is less than 30°.

4. The polymer according to claim 1, wherein the unit X is a rigid planar conjugated system which cannot deviate from planarity by rotation about a single bond.

5. The polymer according to claim 1, wherein the linking of the units of the formula (1) into the polymer takes place via groups $Ar^1$ to $Ar^5$ in such a way that an even number of C atoms or correspondingly O, N and/or S lies between the link to the polymer and the nitrogen or phosphorus or arsenic atom A.

6. The polymer according to claim 1, wherein the units of the formula (1) are bonded into the main chain of the polymer.

7. The polymer according to claim 6, wherein the units of the formula (1) are bonded to the polymer via groups $Ar^1$ and $Ar^3$.

8. The polymer according to claim 1, wherein further structural units are selected from units which form the polymer backbone, modify the morphology or emission colour, enhance the hole-injection and/or hole-transport properties, enhance the electron-injection and/or electron-transport properties, have combinations of the two last-mentioned units, emit light from the triplet state and/or improve the transfer from the singlet state to the triplet state.

9. The polymer according to claim 8, wherein the further structural units comprise at least 50 mol % of units which form the polymer backbone.

10. The polymer according to claim 1, wherein the proportion of units of the formula (1) is 1 to 30 mol %.

11. The polymer according to claim 10, wherein the proportion of units of the formula (1) is 5-30 mol %.

12. The polymer according to claim 1, wherein A, identically or differently on each occurrence, is N or P.

13. The polymer according to claim 1, wherein X, identically or differently on each occurrence, is a group of the formula (3):

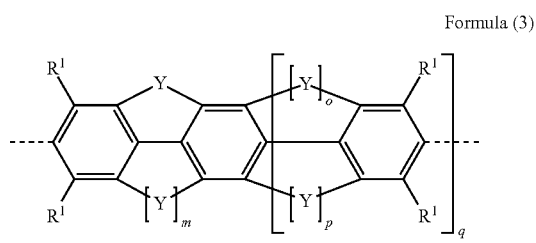

Formula (3)

wherein:
Y is on each occurrence, identically or differently, —C(R$^1$)$_2$—, —C(R$^1$)$_2$—C(R$^1$)$_2$—, —N(R$^1$)—, —O—, —S—, —P(R$^1$)—, —P(=O)(R$^1$)—, —O—C(R$^1$)$_2$— or —O—C(=O)—;

m is on each occurrence, identically or differently, 0 or 1, where in the case where the index m=0, the radical Y is omitted and does not correspond to a chemical bond;

o, p are on each occurrence, identically or differently, 0 or 1, with the proviso that o and p cannot simultaneously be 0, where in the case where one of the indices o or p=0, the radical Y is omitted and does not correspond to a chemical bond;

q is on each occurrence, identically or differently, 0, 1 or 2;
the dashed bond in formula (3) here represents the link from this structural unit to the atom A in structural units of the formula (1).

14. The polymer according to claim 1, wherein Ar$^1$ to Ar$^5$, identically or differently on each occurrence, is an aromatic or heteroaromatic ring system having 4 to 30 C atoms, which may be substituted by R$^1$.

15. The polymer according to claim 1, wherein n, identically or differently on each occurrence, is 0 or 1.

16. The polymer according to claim 1, wherein the units of the formula (1) have a symmetrical structure.

17. The polymer according to claim 1, wherein the polymers are prepared by SUZUKI, YAMAMOTO, STILLE or HARTWIG-BUCHWALD polymerisation.

18. A blend of one or more polymers according to claim 1 with further polymeric, oligomeric, dendritic or low-molecular-weight compounds.

19. A solution or formulation of one or more polymers according to claim 1 in one or more solvents.

20. An electronic component containing one or more layers, wherein at least one of these layers comprises at least one polymer according to claim 1.

21. The electronic component according to claim 20, wherein the electronic component is a polymeric organic light-emitting diode (PLED), an organic field-effect transistor (O-FET), an organic integrated circuit (O-IC), an organic thin-film transistor (O-TFT), an organic solar cell (O-SC), an organic field-quench device (O-FQD) or an organic laser diode (O-laser).

22. An electronic component comprising the polymer according to claim 1.

23. The polymer according to claim 1, wherein the units of the formula (1) are selected from example structures (1) to (30), which is optionally substituted by R$^1$ Example 1

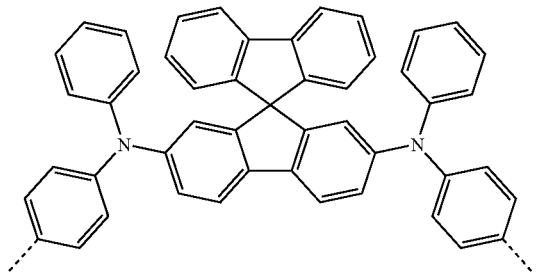

Example 2

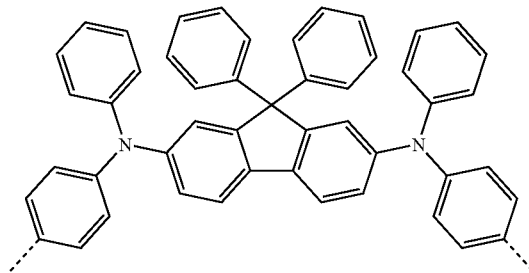

Example 3

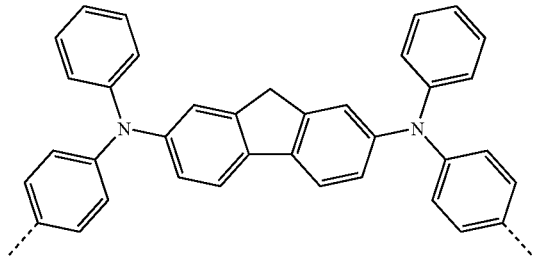

Example 4

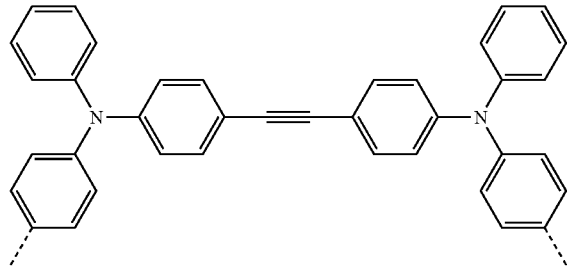

-continued
Example 5
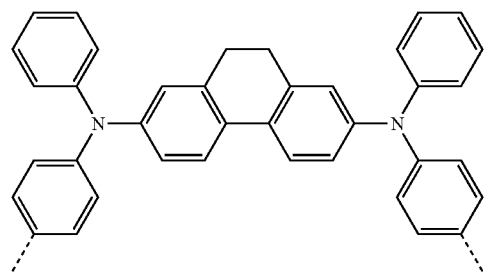
Example 6
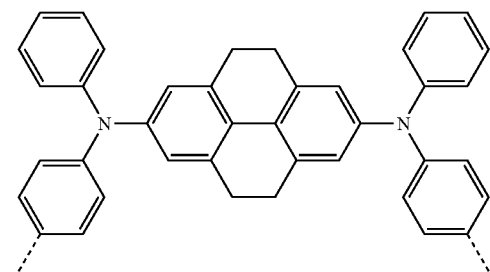
Example 7
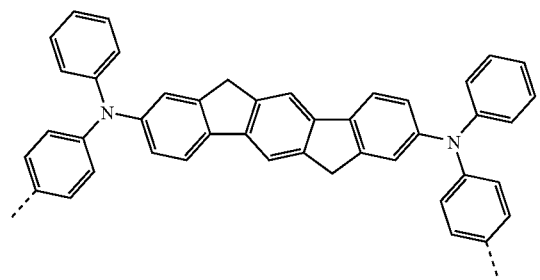
Example 8
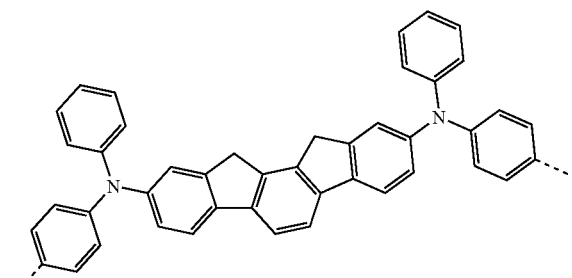
Example 9
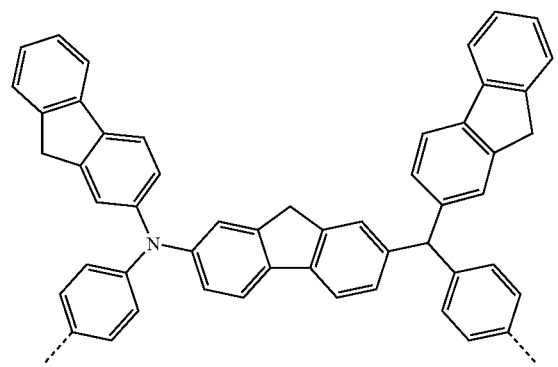
Example 10
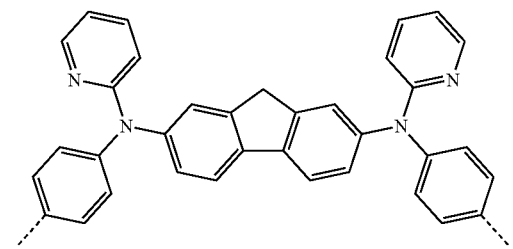
Example 11
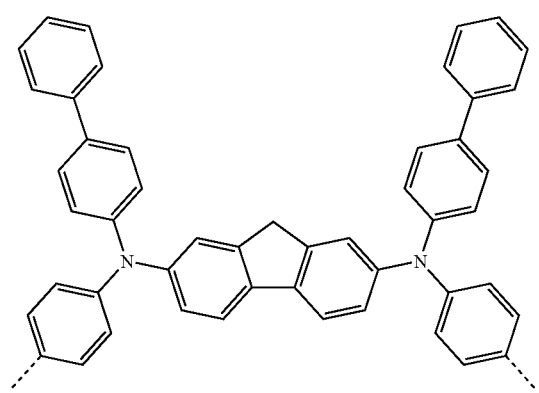
Example 12
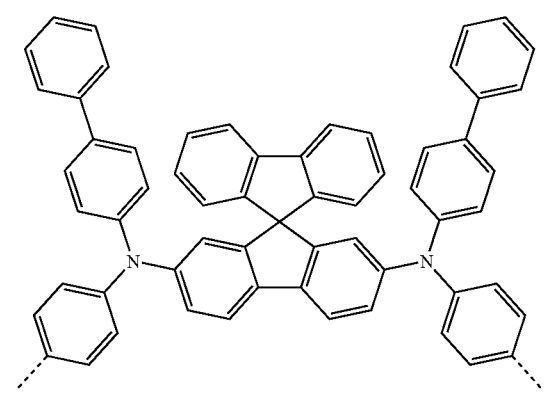

-continued
Example 13
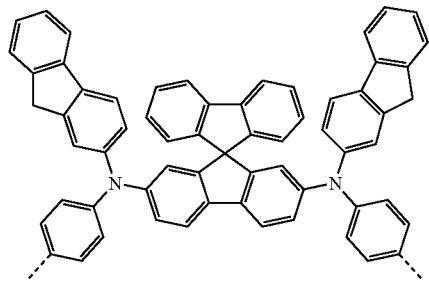
Example 14
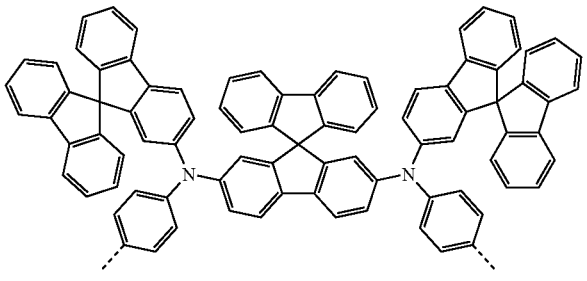
Example 15
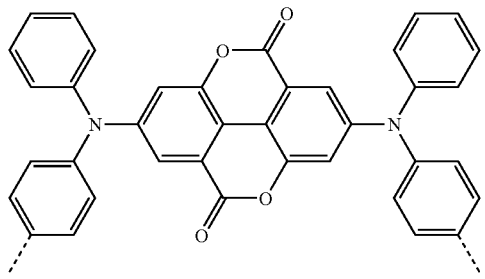
Example 16
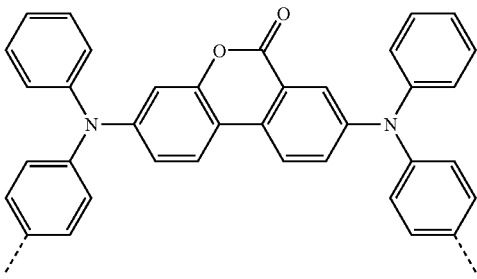
Example 17
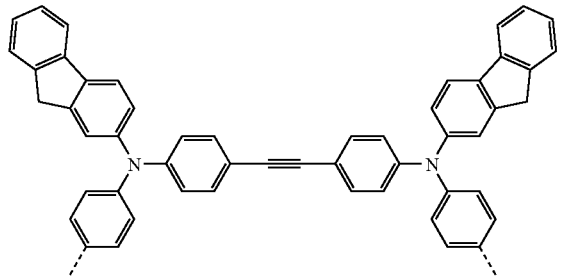
Example 18
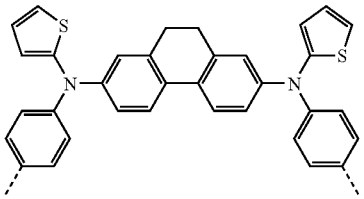
Example 19
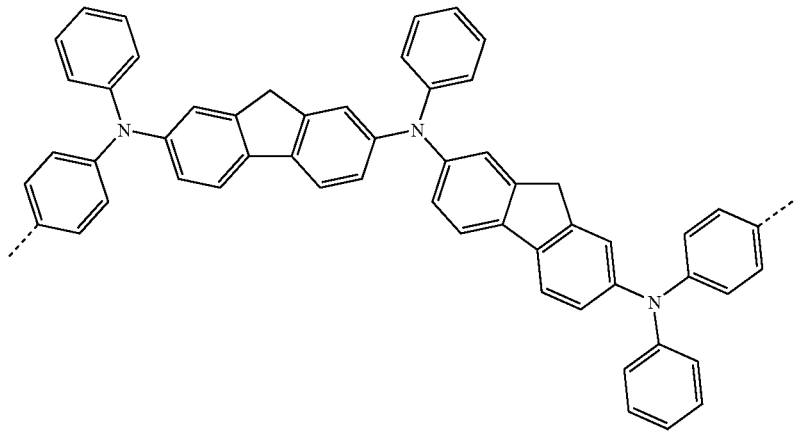
Example 20
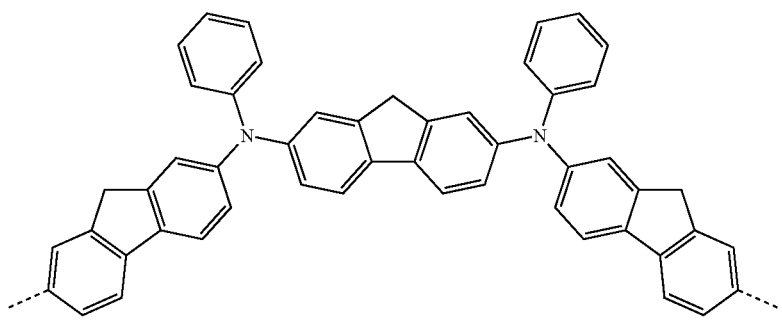

-continued
Example 21
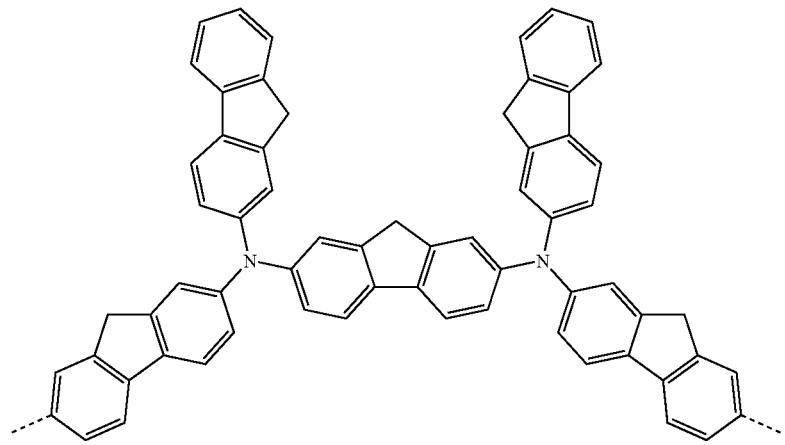
Example 22
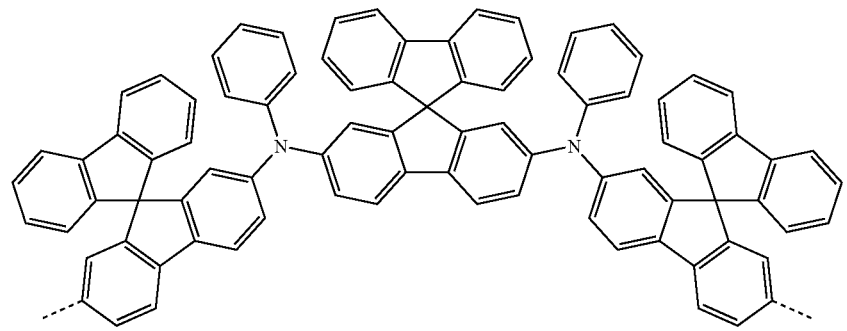
Example 23
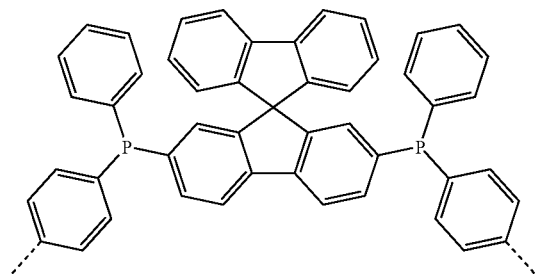
Example 24
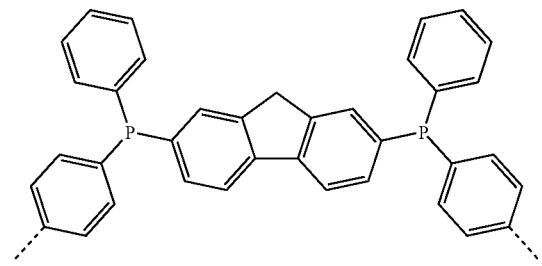
Example 25
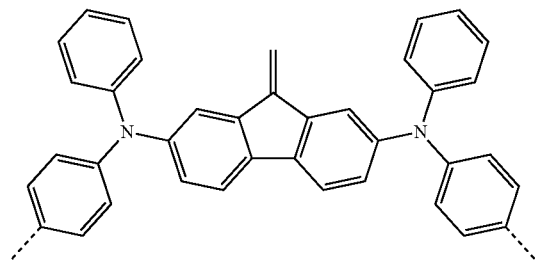
Example 26
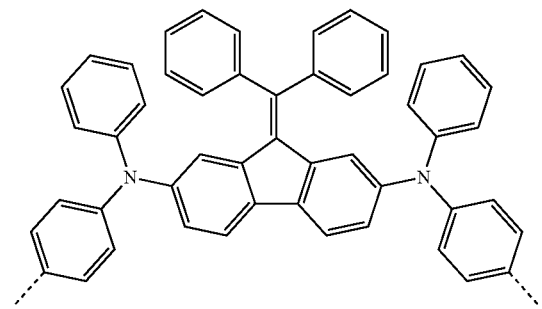

Example 27

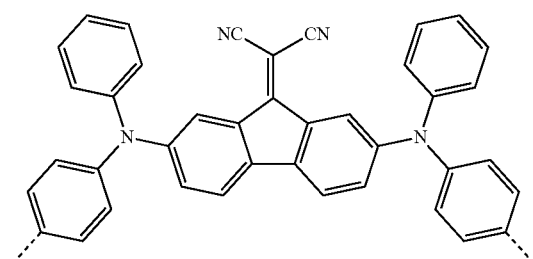

Example 28

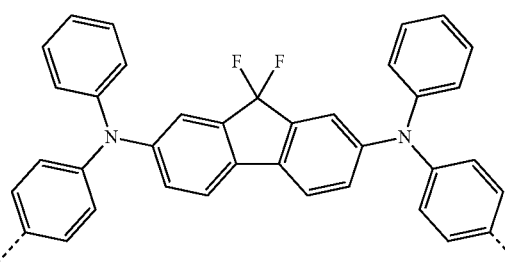

Example 29

Example 30

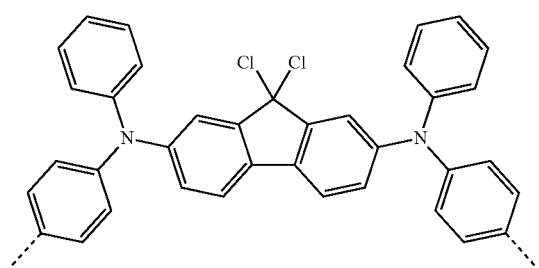

24. A conjugated or partially conjugated polymer comprising at least 0.1 mol % of units of the formula (1)

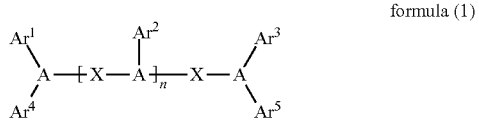

formula (1)

wherein:
A is on each occurrence, identically or differently, N, P or As;
X is on each occurrence, identically or differently, a divalent planar conjugated system having 6 to 40 C atoms, which comprises at least two arylene groups and which is optionally substituted by R1;
$Ar^1, Ar^2, Ar^3, Ar^4$ and $Ar^5$
are on each occurrence, identically or differently, an aromatic or heteroaromatic ring system having 2 to 40 C atoms, which is optionally substituted by one or more radicals $R^1$, with the proviso that none of the groups $Ar^1$ to $Ar^5$ are a fused ring system if this group does not have a direct bond to the polymer chain;
$R^1$ is on each occurrence, identically or differently, H, F, Cl, Br, I, CN, $NO_2$, OH, $N(R^1)_2$, $Si(R^2)_3$, $B(R^2)_2$, a straight-chain, branched or cyclic alkyl, alkoxy or thioalkoxy group having 1 to 40 C atoms, in which, in addition, one or more non-adjacent C atoms is optionally replaced by —$CR^2$=$CR^2$—, —$NR^2$—, —O—, —S—, —CO—O— or —O—CO—O—, where, in addition, one or more H atoms is optionally replaced by fluorine, an aryl, heteroaryl, aryloxy or heteroaryloxy group having up to 40 C atoms, in which, in addition, one or more C atoms is optionally replaced by O, S or N and which, in addition, may be substituted by one or more non-aromatic radicals $R^1$; two or more of the radicals $R^1$ optionally form an aliphatic or aromatic, mono- or polycyclic ring system with one another;

$R^2$ is on each occurrence, identically or differently, H or an aliphatic or aromatic hydrocarbon radical having 1 to 20 C atoms;
n is on each occurrence, identically or differently, 0, 1 or 2;
the linking of the units of the formula (1) to the polymer takes place via one or two of the groups $Ar^1$ to $Ar^5$;
with the exception of the polymer of the formula (2)

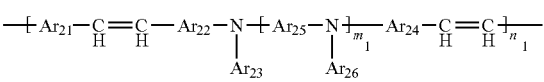

formula (2)

wherein
$Ar_{21}$, $Ar_{22}$, $Ar_{24}$ are each an arylene group, which may carry a substituent; $Ar_{25}$ is an arylene group or a divalent polycondensed ring group, which optionally carry a substituent; $Ar_{23}$ and $Ar_{26}$ are each an alkyl group, an aralkyl group or an aryl group, which optionally carry a substituent; $m_1$ is 0, 1, 2 or 3; $n_1$ is a natural number; and
wherein said conjugated or partially conjugated polymers further comprise two or more different units selected from the group consisting of spirobifluorene, fluorene, dihydrophenanthrene, cis-indenofluorene, trans-indenofluorene, dihydropyrene, and tetrahydropyrene.

25. A conjugated or partially conjugated polymer comprising at least 0.1 mol % of units of the formula (1)

formula (1)

wherein:
A is on each occurrence, identically or differently, N, P or As;
X is on each occurrence, identically or differently, a divalent planar conjugated system having 6 to 40 C atoms, which comprises at least two arylene groups and which is optionally substituted by R1;
$Ar^1$, $Ar^2$, $Ar^3$, $A^4$ and $Ar^5$
are on each occurrence, identically or differently, an aromatic or heteroaromatie ring system having 2 to 40 C atoms, which is optionally substituted by one or more radicals $R^1$, with the proviso that none of the groups $Ar^1$ to $Ar^5$ are a fused ring system if this group does not have a direct bond to the polymer chain;
is on each occurrence, identically or differently, H, F, Cl, Br, I, CN, $NO_2$, OH, $N(R^1)_2$, $Si(R^2)_3$, $B(R^2)_2$, a straight-chain, branched or cyclic alkyl, alkoxy or thioalkoxy group having 1 to 40 C atoms, in which, in addition, one or more non-adjacent C atoms is optionally replaced by $-CR^2=CR^2-$, $-NR^2-$, $-O-$, $-S-$, $-CO-O-$ or $-O-CO-O-$, where, in addition, one or more H atoms is optionally replaced by fluorine, an aryl, heteroaryl, aryloxy or heteroaryloxy group having up to 40 C atoms, in which, in addition, one or more C atoms is optionally replaced by O, S or N and which, in addition, may be substituted by one or more non-aromatic radicals $R^1$; two or more of the radicals $R^1$ optionally form an aliphatic or aromatic, mono- or polycyclic ring system with one another;
$R^2$ is on each occurrence, identically or differently, H or an aliphatic or aromatic hydrocarbon radical having 1 to 20 C atoms;
is on each occurrence, identically or differently, 0, 1 or 2;
the linking of the units of the formula (1) to the polymer takes place via one or two of the groups $Ar^1$ to $Ar^5$;
with the exception of the polymer of the formula (2)

formula (2)

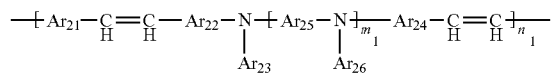

wherein
$Ar_{21}$, $Ar_{22}$, $Ar_{24}$ are each an arylene group, which may carry a substituent; $Ar_{25}$ is an arylene group or a divalent polycondensed ring group, which optionally carry a substituent; $Ar_{23}$ and $Ar_{26}$ are each an alkyl group, an aralkyl group or an aryl group, which optionally carry a substituent; $m_1$ is 0, 1, 2 or 3; $n_1$ is a natural number; and
wherein said conjugated or partially conjugated polymers further comprise one or more units selected from the group consisting of spirobifluorene, fluorene, dihydrophenanthrene, cis-indenofluorene, trans-indenofluorene, dihydropyrene, and tetrahydropyrene and wherein the fluorine or spirobifluorene contains at least one alkoxy group.

26. The polymer as claimed in claim 24, wherein at least one of said further units is spirobifluorene.

27. A blend of one or more polymers according to claim 24 with further polymeric, oligomeric, dendritic or low-molecular-weight compounds.

28. A blend of one or more polymers according to claim 25 with further polymeric, oligomeric, dendritic or low-molecular-weight compounds.

29. An electronic component comprising the polymer according to claim 24.

30. An electronic component comprising the polymer according to claim 24.

31. The electronic component according to claim 29, wherein the electronic component is a polymeric organic light-emitting diode (PLED).

32. The electronic component according to claim 30, wherein the electronic component is a polymeric organic light-emitting diode (PLED).

33. A conjugated or partially conjugated polymer comprising from 0.1 mol % to 30 mol % of units of the formula (1)

formula (1)

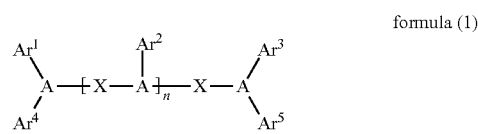

wherein:
A is on each occurrence, identically or differently, N, P or As;
X is on each occurrence, identically or differently, a divalent planar conjugated system having 6 to 40 C atoms, which comprises at least two arylene groups and which is optionally substituted by $R^1$;
$Ar^1$, $Ar^2$, $Ar^3$, $Ar^4$ and $Ar^5$
are on each occurrence, identically or differently, an aromatic or heteroaromatic ring system having 2 to 40 C atoms, which is optionally substituted by one or more radicals $R^1$, with the proviso that none of the groups $Ar^1$ to $Ar^5$ are a fused ring system if this group does not have a direct bond to the polymer chain;
$R^1$ is on each occurrence, identically or differently, H, F, Cl, Br, I, CN, $NO_2$, OH, $N(R^1)_2$, $Si(R^2)_3$, $B(R^2)_2$, a straight-chain, branched or cyclic alkyl, alkoxy or thioalkoxy group having 1 to 40 C atoms, in which, in addition, one or more non-adjacent C atoms is optionally replaced by $-CR^2=CR^2-$, $-NR^2-$, $-O-$, $-S-$, $-CO-O-$ or $-O-CO-O-$, where, in addition, one or more H atoms is optionally replaced by fluorine, an aryl, heteroaryl, aryloxy or heteroaryloxy group having up to 40 C atoms, in which, in addition, one or more C atoms is optionally replaced by O, S or N and which, in addition, may be substituted by one or more non-aromatic radicals $R^1$; two or more of the radicals $R^1$ optionally form an aliphatic or aromatic, mono- or polycyclic ring system with one another;
$R^2$ is on each occurrence, identically or differently, H or an aliphatic or aromatic hydrocarbon radical having 1 to 20 C atoms;
n is on each occurrence, identically or differently, 0, 1 or 2;
the linking of the units of the formula (1) to the polymer takes place via one or two of the groups $Ar^1$ to $Ar^2$;
with the exception of the polymer of the formula (2)

formula (2)

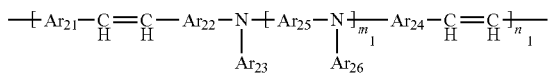

wherein $Ar_{21}$, $Ar_{22}$, $Ar_{24}$ are each an arylene group, which may carry a substituent; $Ar_{25}$ is an arylene group or a divalent polycondensed ring group, which optionally carry a substituent; $Ar_{23}$ and $Ar_{26}$ are each an alkyl group, an aralkyl group or an aryl group, which optionally carry a substituent; $m_1$ is 0, 1, 2 or 3; $n_1$ is a natural number; and wherein said conjugated or partially conjugated polymers further comprise one or more units selected from the group consisting of spirobifluorene, dihydrophenanthrene, cis-indenofluorene, trans-indenofluorene, dihydropyrene, and tetrahydropyrene.

* * * * *